US011447105B2

(12) United States Patent
Shih et al.

(10) Patent No.: US 11,447,105 B2
(45) Date of Patent: Sep. 20, 2022

(54) SYSTEMS AND METHODS FOR MANAGING BATTERIES IN A BATTERY EXCHANGE STATION

(71) Applicant: Gogoro Inc., Hong Kong (CN)

(72) Inventors: I-Fen Shih, New Taipei (TW);
Yun-Chun Lai, Hsinchu (TW);
Chien-Chung Chen, Taoyuan (TW);
Chun-Chen Chen, Kaohsiung (TW);
Yu-Lin Wu, Chiayi (TW)

(73) Assignee: Gogoro Inc., Hong Kong (CN)

( * ) Notice: Subject to any disclaimer, the term of this patent is extended or adjusted under 35 U.S.C. 154(b) by 497 days.

(21) Appl. No.: 16/354,096

(22) Filed: Mar. 14, 2019

(65) Prior Publication Data
US 2019/0299942 A1 Oct. 3, 2019

Related U.S. Application Data

(60) Provisional application No. 62/650,233, filed on Mar. 29, 2018.

(51) Int. Cl.
*B60S 5/06* (2019.01)
*G01R 31/382* (2019.01)
(Continued)

(52) U.S. Cl.
CPC .............. *B60S 5/06* (2013.01); *B60L 53/63* (2019.02); *B60L 53/80* (2019.02); *B60L 58/13* (2019.02);
(Continued)

(58) Field of Classification Search
CPC ...... B60S 5/06; G01R 31/382; H01M 10/441; H01M 10/482; H02J 9/06; H02J 9/061; H02J 7/342; H02J 7/0027
(Continued)

(56) References Cited

U.S. PATENT DOCUMENTS 6,593,723 B1 * 7/2003 Johnson .............. H01R 25/006
320/113
2010/0320957 A1 * 12/2010 Teufel .................. H02J 7/0013
320/101
(Continued)

FOREIGN PATENT DOCUMENTS

CN          105493378 A      4/2016
EP            2641773 A2      9/2013
(Continued)

OTHER PUBLICATIONS

Korean Office Action received for co-pending Korean Patent Application No. KR10-2019-0035775; Applicant; Gogoro Inc.; dated Oct. 29, 2020, 4 pages.
(Continued)

*Primary Examiner* — Nathaniel R Pelton
(74) *Attorney, Agent, or Firm* — Perkins Coie LLP

(57) ABSTRACT

The present disclosure relates to methods and associated systems for operating a battery exchange station. The present technology (1) receives battery information from a memory attached to each of a plurality of exchangeable batteries positioned in the battery exchange station; (2) receives a battery demand prediction associated with the battery exchange station; and (3) identifying one or more uninterruptible-power-supply (UPS) batteries from the plurality of exchangeable batteries at least partially based in part on the battery demand prediction and individual state of charges (SoCs) of the plurality of exchangeable batteries.

19 Claims, 9 Drawing Sheets

(51) Int. Cl.
  *B60L 53/80* (2019.01)
  *H01M 10/44* (2006.01)
  *H01M 10/48* (2006.01)
  *B60L 58/13* (2019.01)
  *H02J 9/06* (2006.01)
  *H02J 7/00* (2006.01)
  *B60L 53/63* (2019.01)
  *H02J 7/34* (2006.01)

(52) U.S. Cl.
  CPC ........ *G01R 31/382* (2019.01); *H01M 10/441* (2013.01); *H01M 10/482* (2013.01); *H02J 7/0027* (2013.01); *H02J 7/342* (2020.01); *H02J 9/06* (2013.01); *H02J 9/061* (2013.01)

(58) Field of Classification Search
  USPC .......................................... 320/109
  See application file for complete search history.

(56) References Cited

U.S. PATENT DOCUMENTS

| | | | | |
|---|---|---|---|---|
| 2013/0031318 | A1* | 1/2013 | Chen | B60L 7/06 711/154 |
| 2013/0063073 | A1* | 3/2013 | Kawasaki | H02J 7/0045 320/101 |
| 2016/0105044 | A1* | 4/2016 | Yamaguchi | H02J 7/0013 320/112 |
| 2016/0226268 | A1* | 8/2016 | Okui | H02J 7/0071 |
| 2016/0233810 | A1* | 8/2016 | Williams | G06Q 30/00 |
| 2017/0053459 | A9* | 2/2017 | Luke | B60L 53/665 |
| 2017/0097652 | A1* | 4/2017 | Luke | G07F 9/001 |
| 2018/0043785 | A1 | 2/2018 | Takatsuka et al. | |
| 2019/0067989 | A1* | 2/2019 | Beg | H02J 7/0068 |
| 2020/0014210 | A1* | 1/2020 | Arnold | H02J 3/383 |

FOREIGN PATENT DOCUMENTS

| | | |
|---|---|---|
| EP | 2724886 A1 | 4/2014 |
| JP | 2009140507 A | 6/2009 |
| JP | 2011096233 A | 5/2011 |
| JP | 2016-212655 A | 2/2016 |
| JP | 2016077139 A | 5/2016 |
| KR | 20130044166 A | 5/2013 |
| WO | 2013080211 A1 | 6/2013 |

OTHER PUBLICATIONS

European Search Report issued for corresponding European Application No. EP19166191.7, Applicant: Gogoro Inc., dated Aug. 19, 2019, 4 pages.
Office Action received for co-pending Indian Application No. IN201914012262, Applicant: Gogoro Inc., dated Jun. 8, 2020, 5 pages.
Notice of Publication received for co-pending Philippines Application No. PH1-2019-000146, Applicant: Gogoro Inc., dated Oct. 16, 2019, 3 pages.
Office Action received for co-pending Japanese Application No. JP 2019-063182, Applicant: Gogoro Inc., dated Mar. 24, 2020, 4 pages.
Office Action received for co-pending Taiwanese Application No. TW108111052, Applicant: Gogoro Inc., dated Mar. 4, 2020, 8 pages.
Korean Office Action received for co-pending Korean Patent Application No. KR10-2019-0035775; Applicant; Gogoro Inc.; dated Apr. 8, 2021, 4 pages.

* cited by examiner

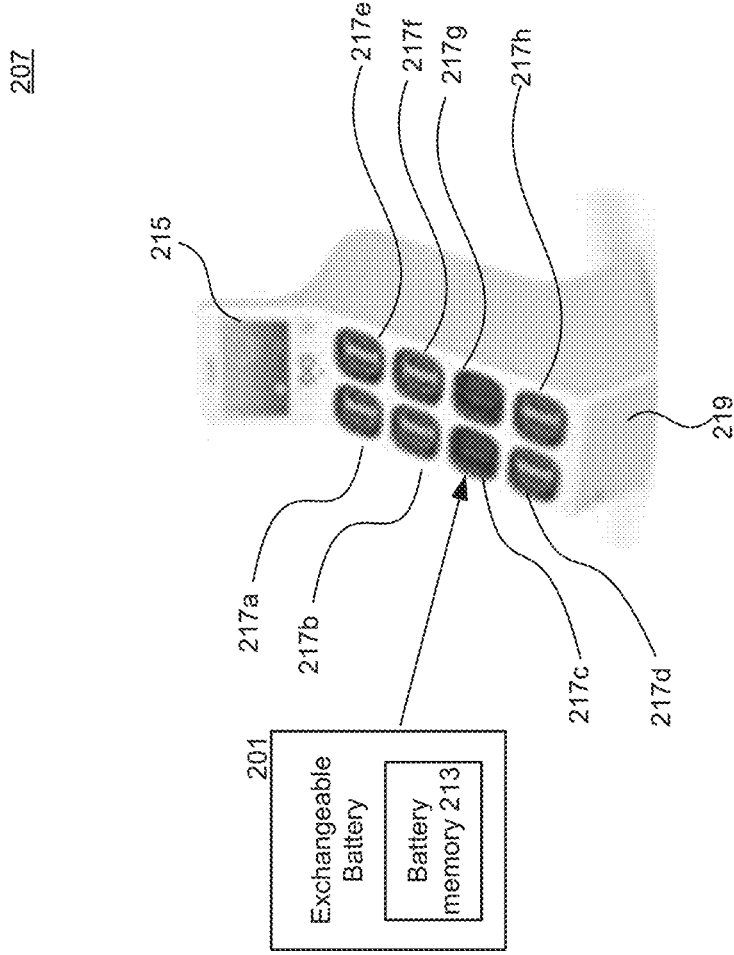

SYSTEMS AND METHODS FOR MANAGING BATTERIES IN A BATTERY EXCHANGE STATION

CROSS-REFERENCE TO RELATED APPLICATION

The present application claims the benefit of and priority to U.S. Provisional Application No. 62/650,233, filed Mar. 29, 2018, which is incorporated herein by reference in its entirety.

TECHNICAL FIELD

The present technology is directed to systems and methods for managing a plurality of exchangeable energy storage devices positioned in a storage-device exchange station. More particularly, the present technology is directed to systems and methods for managing a plurality of exchangeable batteries in a battery-swap station when a power supply coupled to the battery-swap station is temporarily out of service.

BACKGROUND

An exchangeable battery-swap station is designed to manage a plurality of exchangeable batteries such that these batteries can be readily used by one or more users. For example, the battery-swap station uses power from an external power supply to charge a depleted battery such that the depleted battery can be provided to a user once it is charged. However, sometimes the power from the external power supply can be interrupted. When the external power supply is interrupted, it is challenging to keep providing battery services to users. Therefore, it is advantageous to have improved systems and methods to address these issues.

BRIEF DESCRIPTION OF THE DRAWINGS

Embodiments of the disclosed technology will be described and explained through the use of the accompanying drawings.

FIG. 2 is a schematic diagram illustrating a battery exchange station in accordance with embodiments of the disclosed technology.

Figure 1:
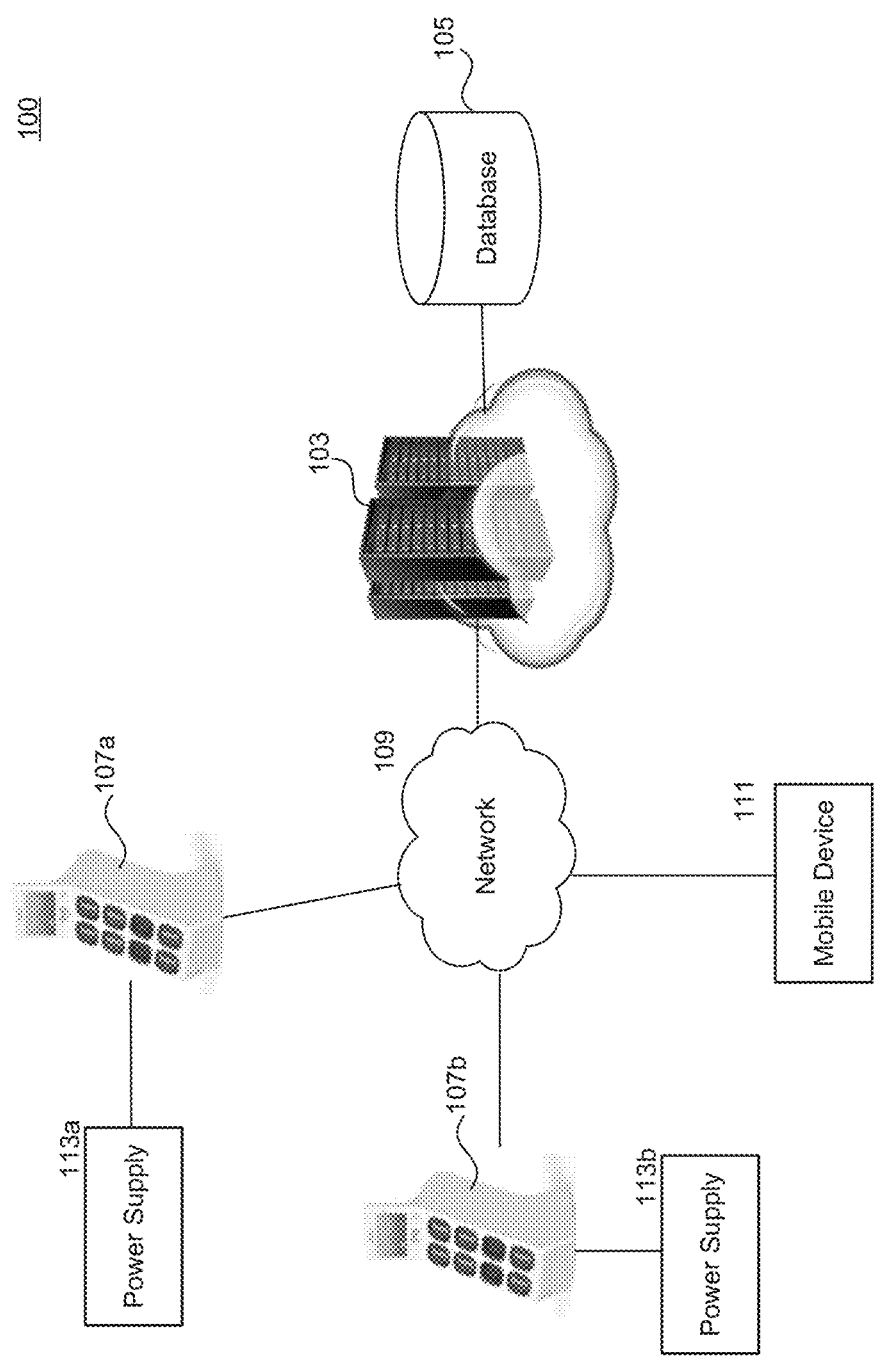
FIG. 1 is a schematic diagram illustrating a system in accordance with embodiments of the disclosed technology.

The drawings are not necessarily drawn to scale. For example, the dimensions of some of the elements in the figures may be expanded or reduced to help improve the understanding of various embodiments. Similarly, some components and/or operations may be separated into different blocks or combined into a single block for the purposes of discussion of some of the embodiments. Moreover, although specific embodiments have been shown by way of example in the drawings and described in detail below, one skilled in the art will recognize that modifications, equivalents, and alternatives will fall within the scope of the appended claims.

DETAILED DESCRIPTION

In this description, references to "some embodiments," "one embodiment," or the like, mean that the particular feature, function, structure or characteristic being described is included in at least one embodiment of the disclosed technology. Occurrences of such phrases in this specification do not necessarily all refer to the same embodiment. On the other hand, the embodiments referred to are not necessarily mutually exclusive.

The disclosed system/technology is directed to systems and methods for managing multiple exchangeable batteries in a battery exchange station such that the station can continuously provide service during interrupting events such as a power outage. More particularly, for example, the disclosed system enables the station to designate/use one or more exchangeable batteries in the battery exchange station as a "temporary power supply" or as an "Uninterruptible Power Supply (UPS) battery." The designated UPS batteries can then be used as an "internal" power source for tasks such as charging other batteries, providing power to system components (e.g., a processor, a controller, a display, a communication component, etc.), and/or other suitable operations. When using the UPS batteries to charge a battery, the present technology can follow a set of charging rules associated with the characteristics of the battery-to-be-charged. Details of the charging rules are discussed in Applicant's U.S. provisional application No. 62/612,249, titled "SYSTEMS AND METHODS FOR MANAGING EXCHANGEABLE ENERGY STORAGE DEVICE STATIONS", which is incorporated by reference in its entirety.

In some embodiments, the present technology can use on or more factors to determine which battery can be a UPS battery. These factors include, for example, a state of charge (SoC) of a battery, a battery temperature, battery characteristics (e.g., a manufacturer, a manufacturing date/batch, charging/discharging cycles, a temperature profile measured when the battery discharges or is charged, a battery life expectancy, etc.), a battery status (e.g., normal, abnormal, to-be-maintained, to-be-replaced, locked, releasable, dischargeable, etc.), a total number of batteries in the battery exchange station, the location of the battery exchange station (e.g., on a busy street, in a remote recreational area, etc.), a distance between the battery exchange station and a service center (e.g., the service center is capable of sending a service crew to bring in fully-charged or nearly-charged batteries to replace depleted batteries in the battery exchange station), an expected power-interruption recovery time (e.g., historical records show that an average recovery time for a power outage is about 90 minutes in the area where the battery exchange station is located), an expected operational time of the battery exchange station without an external power supply (e.g., 1-5 hours, calculated based on available internal power sources, including the designated UPS batteries), an expected battery demand (e.g., according to a battery demand prediction, the battery exchange station is going to have 3 battery exchanges in the next hour), etc. When a battery is designated as the UPS battery, it is locked, not to be charged, and ready to discharge (e.g., the charger coupled to the UPS battery is in a discharging mode such that the UPS battery can readily discharge to power the station or other batteries).

In some embodiments, determining UPS batteries can depend on whether there are enough fully-charged batteries in a station. A "fully-charged" battery refers to a battery that has a sufficient SoC (e.g., higher than a threshold SoC). The threshold SoC can vary in different embodiments, for example, ranging from 85% to 99% SoC. When there are enough fully-charged batteries available (e.g., can be readily provided to a user), the present technology can identify a battery that has a high SoC as a UPS battery. The rationale includes that, as long as a battery is fully-charged, the system may want that battery to be picked up by a user as soon as possible, because maintaining a fully-charged battery in the station also consumes power (and thus expenses). When there are not enough "fully-charged batteries" to be provided to a user, the present technology can still identify a battery (e.g., that has a predetermined, relatively-low SoC) as a UPS battery. By this arrangement, the system can use the power in the identified UPS battery to charge a remaining battery with the highest SoC such that at least one battery (or one set/pair of batteries) can be ready to be exchanged by a user soon. Embodiments are discussed in detail below with reference to FIG. 5.

In some embodiments, in addition to the UPS battery, the present technology can also identify, from the remaining exchangeable batteries in a battery exchange station, one or more "UPS candidate batteries" or "secondary UPS batteries" that can potentially be used to provide power together with the identified UPS battery. In some embodiments, the power provided by the UPS battery and the UPS candidate batteries can maintain or sustain the operation of the battery exchange station for a predetermined minimum operation time (e.g., 1-4 hours). During the minimum operation time, the battery exchange station can operate as if there is no power interruption (e.g., users will not notice the power interruption). In some embodiments, the present technology can designate all or a portion of available "dischargeable" batteries as UPS candidate batteries. For a battery to be "dischargeable," the battery (1) contains enough electric energy to discharge (e.g., no less than 5-10% SoC) and (2) is currently coupled to a charger that allows bi-directional electric flow. In some embodiments, the minimum operation time can be determined based on the distance between a station and a service center or a service crew dispatching center.

When the external power supply for the battery exchange station is not interrupted, the station (or a server communicably coupled to the station) can identify one or more UPS batteries (and one or more UPS candidate batteries, in some embodiments). In some embodiments, the UPS battery (and the UPS candidate battery) can be selected based on the SoCs of the batteries in the battery exchange station. For example, assume that there are six batteries B1-B6 in a station, with 90%, 89%, 75%, 60%, 40%, and 30% SoCs, respectively. In this example, battery B6 with 30% SoC (i.e., the one with the lowest SoC) can be selected as the UPS battery and be locked (e.g., not to be charged; ready to discharge). In the embodiments where the UPS battery alone is sufficient to sustain the station to operate for the minimum operation time, the UPS candidate battery can be optional.

In the embodiments where the UPS battery alone is not sufficient to sustain the station to operate for the minimum operation time, the UPS candidate battery can be selected to support the station. For example, assuming that the minimum operation time is "two hours," and the minimum power for the station to operate for two hours generally equals to 120% SoC of a battery (assuming batteries B1-B6 are the same type of batteries, which means their fully-charged capacities, i.e., 100% SoC, are the same), batteries B4 and B5 can be selected as the UPS candidate batteries. In the foregoing example, the power provided by the UPS battery (30% SoC; from battery B6) and the power provided by the UPS candidate batteries (40% SoC from battery B5 and 60% SoC from battery B4) together can sustain the station to operate for at least the minimum operation time (namely, the sum of 30%, 40% and 60% SoCs is greater than 120% SoC) when there is a power interruption.

In some embodiments, battery B1 with 90% SoC (i.e., the one with the highest SoC) can be selected as the UPS battery and be locked. In such embodiments, battery B6 can be selected as the UPS candidate battery. In this example, the power provided by the UPS battery (90% SoC; from battery B1) and the power provided by the UPS candidate battery (30% SoC from battery B6) together can sustain the station to operate for at least the minimum operation time (namely, the sum of 90% and 30% SoCs equals 120% SoC) when there is a power interruption.

In some embodiments, battery B with 89% SoC (i.e., the one with the highest SoC among the batteries having SoCs lower than 90%; the battery having 90% SoC is ready to be picked up by a user) can be selected as the UPS battery and be locked. In this example, the power provided by the UPS battery (89% SoC; from battery B2) and the power provided by the UPS candidate battery (40% SoC from battery B5) together can sustain the station to operate for at least the minimum operation time (namely, the sum of 89% and 40% SoCs is greater than 120% SoC) when there is a power interruption.

In some embodiments, for example, once a UPS battery is taken by a user, the present technology can then select a UPS candidate battery to become a new UPS battery. In some embodiments, the UPS candidate batteries can be configured to only provide power for system operations, whereas the UPS batteries can be configured as power sources to charge other batteries. In some embodiments, the present technology can dynamically adjust the identified UPS batteries and the UPS candidate batteries. For example, the system can identify two UPS batteries to charge two other batteries according to a reservation made by a user. The system can later receive a cancellation of that reservation (or the reservation expires if the user does not pick up the reserved batteries before a pre-determined time). Then the system can reassign the two UPS batteries as UPS candidate batteries. As another example, in response to an urgent battery exchange reservation, the system can switch three previously-identified UPS candidate batteries to UPS batteries, so as to accommodate the urgent reservation.

In some embodiments, prior to identifying the UPS (and UPS candidate) batteries, the present technology can first identify one or more "dischargeable batteries" from the exchangeable batteries in a battery exchange station. The system can then select the UPS (and UPS candidate) batteries from the dischargeable batteries. The dischargeable batteries can be defined as batteries that are capable of discharging electric current. For example, in some embodiments, the system can determine whether a battery is "dischargeable" based on its SoC (e.g., no less than 5-10% SoC). In other embodiments, the dischargeable batteries can be determined based on one or more other battery characteristics (e.g., temperature, charging cycles, internal resistance, internal error/warning, conditions, etc.). In some embodiments, the present technology can include a battery management system (BMS) configured to monitor the status of each battery associated with the BMS. In some embodiments, the status of a battery can be stored in a battery memory coupled to or associated with the battery. In some embodiments, the status of a battery can also be transmitted to a server.

Another aspect of the present technology is directed to systems and methods that determine which battery is to be provided to a user when a user requests a battery exchange. The system can be implemented in a server, each of the multiple battery exchange stations, and/or both. Each of the stations monitors the status of the exchangeable batteries positioned therein and identifies one or more UPS batteries and UPS candidate batteries. In some embodiments, the stations can generate a list of the identified UPS batteries and UPS candidate batteries. The list can be stored at the stations or transmitted to the server. Each of the stations can update the list frequently (e.g., every 10 minutes) or in response to a battery exchange (e.g., a user takes a charged battery from a station and inserts a depleted one therein) or a power-supply change (e.g., a power outage, a power interruption, an abnormal/unstable power supply, etc.). Each of the stations also monitors the status of its power supply (e.g., whether it supplies power as expected, any abnormal/error indication, etc.). The power supply information monitored by each of the stations can be stored locally and/or transmitted to the server. In some embodiments, the stations can determine a charging plan for each of the exchangeable batteries therein. In some embodiments, these charging plans can be determined by the server.

In the embodiments where the server determines the charging plans, the server can (1) receive status information from one or more battery exchange stations; (2) determine a station state (e.g., normal, online, abnormal, offline, disconnected, under maintenance, etc.) of each battery exchange station; and (3) based on the station state, generate a charging plan for each battery exchange station. The generated charging plan includes determining the charging priorities of the batteries in each of the multiple battery exchange stations. In the embodiments where the station determines the charging plans, the station can (a) determine a station state (e.g., normal, online, abnormal, offline, disconnected, under maintenance, etc.); (b) based on the station state, identify one or more UPS batteries (and one or more UPS candidate batteries); (c) generate a charging plan based on the identified UPS batteries (and UPS candidate batteries) and the characteristics of the batteries. In some embodiments, the charging priorities can be different during different time periods.

For example, when a battery exchange demand is high (i.e., "critical hours"), the charging priorities can be in the following order: (1) non-fully-charged batteries, sorted by SoC in a descending order; (2) fully-charged batteries, sorted by SoC in a descending order; and (3) "locked" batteries (e.g., those batteries that cannot be exchanged or taken by a user), sorted by SOC in a descending order. These charging priorities are discussed in detail below. With limited power supply (e.g., the UPS batteries), the station will charge the batteries with higher priorities first and then the batteries with lower priorities (e.g., only if the station has remaining power to do so). Embodiments are to be discussed in detail below with reference to FIG. 5.

When a battery exchange demand is not particularly high (i.e., "non-critical hours"), the charging priorities can be in the following order: (i) fully-charged batteries, sorted by SoC in a descending order; (ii) non-fully-charged batteries, sorted by SoC in a descending order; (3) UPS candidate batteries, sorted by SoC in a descending order; and (4) "locked" batteries, sorted by SoC in a descending order. Differences between the charging priorities of a station during "critical hours" and "non-critical hours" include, for example, during "critical hours," the charging priorities of fully-charged batteries are lower than those of the non-fully-charged batteries and UPS candidate batteries. This is because, for example, during "critical hours," a station may not have time to further charge its fully-charged batteries to their 100% SoCs (as described above, the fully-charged batteries can have only 85-99% SoC). Due to a high battery exchange demand, the station may need to provide the fully-charged batteries "as is" so as to meet the high battery exchange demand.

In some embodiments, the UPS batteries and UPS candidate batteries are not to be provided to users. In other embodiments, however, the UPS batteries and UPS candidate batteries can still be provided to a user, so as to fulfill a battery demand. For example, a battery can be designated as a UPS battery when it has 87% SoC. After using this UPS battery as internal power supply, its SoC becomes 85%. For certain battery users, a battery with 85% SoC is sufficient for their needs (e.g., they don't drive or ride very far). In such cases, this 85% SoC UPS battery can still be provided to a user when circumstances warrant it.

The present technology is also directed to systems and methods for managing a temporary, "self-contained" battery exchange station. More particularly, the self-contained battery exchange station can operate (e.g., provide exchangeable batteries to users) for a certain period of time without an external power supply. The present technology enables the station to maximize its operation time by using a portion of the exchangeable batteries therein as an internal power supply. This is advantageous for remote battery exchange stations that may be affected by occasional power supply interruption.

In the following description, for the purposes of explanation, numerous specific details are set forth in order to provide a thorough understanding of embodiments of the present technology. It will be apparent, however, that embodiments of the present technology may be practiced without some of these specific details.

FIG. 1 is a schematic diagram illustrating a system 100 in accordance with embodiments of the disclosed technology. The system 100 is configured to manage multiple exchangeable batteries positioned in a plurality of battery exchange stations, respectively. As shown, the system 100 includes a server 103, a database 105 coupled to the server 103, and multiple battery exchange stations 107a, b (only two stations 107a and 107b are shown in FIG. 1). Each of the battery exchange stations 107a, b is coupled to a power supply 113 (only two power supplies 113a and 113b are shown in FIG. 1). The power supply 113 provides power to the battery exchange station 107 for charging the exchangeable batteries positioned therein and for maintaining its other operations (e.g., displaying, communications, computation, etc.). In some embodiments, the power supply 113 can include a public power line/grid/station, a private power line/grid/station, and/or other suitable energy storage devices/media. In some embodiments, the battery exchange station 107 can be electrically coupled to two or more power supplies/sources to receive power to charge the batteries positioned therein and to perform other operations.

As shown, the battery exchange stations 107a, b can communicate with the server 103 via a network 109. The server 103 is configured to collect information (e.g., power supply status, battery information, etc.) through the battery exchange stations 107a, b via the network 109. In some embodiments, the server 103 can receive information from a battery memory coupled to or associated with the exchangeable battery via the network 109. In some embodiments, the server 103 can receive information from the battery memory through a mobile device 111 (e.g., a battery user's smartphone that has an app configured to communicate with the exchangeable battery and/or the station 107a, b) via the network 109. In some embodiments, the server 103 can receive information from the battery memory through an electric vehicle.

After collecting the information from the stations 107a, b, the server 103 can analyze the collected information to determine a status of each of the stations 107a, b. The status of the stations 107a, b can include a power supply status (e.g., normal, abnormal, interrupted, terminated, etc.), a communication status (e.g., online, offline, weak signals, etc.), a battery status (e.g., numbers, SoCs, temperature, and/or other suitable battery characteristics), and/or other suitable information associated with the stations 107a, b. Based on the collected information, the server 103 can identify "UPS batteries" from the existing batteries in each of the stations 107a, b, and generate a customized battery charging plan for each of the stations 107a, b. The UPS batteries are configured to be used as an "internal" power source for tasks such as charging other batteries, providing power to system components (e.g., a display, a communication component, etc.), and/or other suitable operations. In some embodiments, the server 103 can also identify "UPS candidate batteries" that can potentially be identified as UPS batteries. Embodiments of the server 103 are further discussed in detail below with reference to FIG. 4.

Factors to consider when determining UPS batteries includes one or more of a battery SoC, a battery temperature (e.g., a current temperature or temperatures recorded in the past when the battery is charged or discharged), battery characteristics (e.g., a manufacturer, a manufacturing date/batch, charging/discharging cycles, a temperature profile when the battery discharged or was charged, etc.), a battery status (e.g., normal, abnormal, to-be-maintained, to-be-replaced, locked, releasable, dischargeable, etc.), a total number of batteries in the station (e.g., stations 107a, b), the location of the station (e.g., on a busy street, in a remote recreational area, etc.), and a distance between the station and a service center or a service crew dispatching center. The factors can also include an expected power-interruption recovery time, an expected operational time of the station without power from the (external) power supply 113, an expected battery demand (e.g., according to a battery demand prediction based on historical data, the battery exchange station is going to have 3 battery exchanges in the next hour), etc.

Factors to consider when determining a customized charging rule for a specific type of battery include, for example, one or more of (1) battery manufacturing information (e.g., battery manufacturers, manufacturing dates, manufacturing batches, manufacturing serial numbers, hardware versions, firmware versions, cell types, etc.), (2) battery characteristic information (e.g., a battery capacity, a battery discharging capacity, a suggested battery working temperature, a state of heath (SoH), etc.); (3) battery charging information (e.g., SoC information, a current battery temperature, a current cell temperature, a current circuit temperature, an error status, a suggested battery charging temperature, a suggested battery charging current, a suggested battery charging voltage, a suggested battery charging cycle, a suggested battery charging speed, a suggested battery charging time, etc.); (4) battery usage information (e.g., a battery age, a battery internal resistance, an actual battery charging temperature, an actual battery charging current, an actual battery charging voltage, an actual battery charging cycle, an actual battery charging speed, an actual battery charging time, an actual battery working temperature, an actual battery discharging time, etc.), and (5) battery identity information (e.g., a unique battery serial number for each deployed battery).

When an exchangeable battery is positioned in the station 107a, b, the exchanger battery is coupled to a charger (which can include, for example, an electrical coupler, fitting, conduit, etc.). The charger is configured to charge the exchangeable battery. In some embodiments, the charger can be a bi-directional charger which enables the battery attached to discharge and to be charged. In some embodiments, when designating a UPS battery, the server 103 can also consider the capability of the charger of the station 107a, b. For example, if the charger coupled to a battery is not a bi-directional charger, the server 103 will not select this battery as a UPS battery or UPS candidate battery.

The database 105 can store information associated with the present disclosure (e.g., information collected by the server 103, information analyzed by the server 103, information generated by the server 103, power supply information, user account information, user battery plans, user histories, user behavior, user driving/riding habits, environmental conditions, event information, etc.). In some embodiments, the database 105 can be a publicly accessible database (e.g., power interruption alert/notification database, weather forecast database, travel alert database, traffic information database, location service database, map database, etc.) maintained by government or private entities. In some embodiments, the database 105 can be a private database that provides proprietary information (e.g., information of private power service provider, user accounts, user credit histories, user subscription information, etc.).

The network 109 can be a local area network (LAN) or a wide area network (WAN), but it can also be other wired or wireless networks. The network 109 can be the Internet or some other public or private network. The battery exchange station 107 or the mobile device 111 can be connected to the network 109 through a network interface (e.g., by wired or wireless communication). The server 103 can be coupled to the database 105 via any kind of local, wide area, wired, or wireless network, including the network 109 or a separate public or private network. In some embodiments, the network 109 includes a secured network that is used by a private entity (e.g., a company, etc.).

In some embodiments, the battery exchange station (e.g., station 107a, b) can be configured to (1) collect information from the exchangeable batteries positioned therein, (2) analyze the collected information, and then (3) identify one or more UPS batteries (and UPS candidate batteries) from the exchangeable batteries positioned therein based on the analysis. In such embodiments, the battery exchange station can generate a customized battery charging plan for each battery therein based on battery characteristics and a predicted battery demand. For example, the station can include eight chargers, which are all bi-directional chargers. Currently, there are six batteries positioned in the station (e.g., the two "empty" chargers are for a user to insert depleted batteries). The six batteries have 88%, 75%, 60%, 55%, 50%, and 45% SoC, respectively. The station receives a user reservation for two batteries to be picked up in two hours and a battery demand prediction indicates that there will be two battery exchanges in the next hour (i.e., the total battery demand is 4 in two hours).

Assuming that the power supply 113 is interrupted (e.g., in some embodiments, the system can have a backup power supply to make sure that one or more UPS batteries can be selected and connected) and the lowest SoC threshold of a battery that the station can provide to a user is 90%, the stations 107a, b can then designate the 50% SoC battery and the 45% SoC battery as UPS batteries. In this example, the two UPS batteries can be used to charge the 88% SoC battery and the 75% SoC battery, such that the expected battery demand can be met. In some embodiments, the UPS battery and the UPS candidate battery are ready to discharge (e.g., in a bi-directional charger and the charger is set to discharge the battery therein). In some embodiments, the UPS battery and the UPS candidate battery can be electrically coupled to a power bus (e.g., FIG. 3B) such that they can discharge their power to sustain the operation of the stations 107a, 107b or to charge other batteries therein. In some embodiments, the power bus can be optional (e.g., the batteries are electrically coupled to the mains electricity via corresponding chargers that are individually and respectively connected to the mainboard). Embodiments of the battery exchange stations 107a b are discussed in detail below with reference to FIGS. 2, 3A, and 3B.

FIG. 2 is a schematic diagram illustrating a battery exchange station 207 in accordance with embodiments of the disclosed technology. The battery exchange station 207 can determine a customized battery charging plan for the battery exchange station 207. The battery exchange station 207 can communicate with a server, a database, a mobile device, a vehicle, and/or another battery exchange station via a network.

As shown, the battery exchange station 207 includes (i) a display 215 configured to interact with a user, and (ii) a battery rack 219 having eight battery slots 217a-h configured to accommodate batteries to be charged. In the illustrated embodiments, each of the slots 217a-h includes a bi-directional charger positioned therein and configured to couple to an exchangeable battery. During operation, only six battery slots (e.g., slots 217a, 217b, 217d, 217e, 217f, and 217h) are occupied by batteries, and the remaining two slots (e.g., slots 217c and 217g) are reserved for a user to insert depleted batteries. In some embodiments, the battery exchange station 207 can have different arrangements such as different numbers of racks, displays, and/or slots. In some embodiments, the battery exchange station 207 can include modular components (e.g., modular racks, modular displays, etc.) that enable an operator to conveniently install or expand the battery exchange station 207.

In some embodiments, a user can remove a battery from the battery exchange station 207, without inserting one beforehand. In some embodiments, the battery exchange station 207 can have a locking mechanism for securing the batteries positioned therein. In some embodiments, the battery exchange station 207 can be implemented without the locking mechanism.

When a user inserts an exchangeable battery 201 (which includes a battery memory 213 configured to store various types of battery information) into an empty battery slot (e.g., slot 217c, as shown in FIG. 2) of the battery exchange station 207, connections are made to the battery memory 213, and the station 207 can start collecting information from the battery memory 213. In some embodiments, the collected information can be stored in the station 207. In some embodiments, the station 207 can transmit the collected information to a server (e.g., the server 103).

Figure 3A:
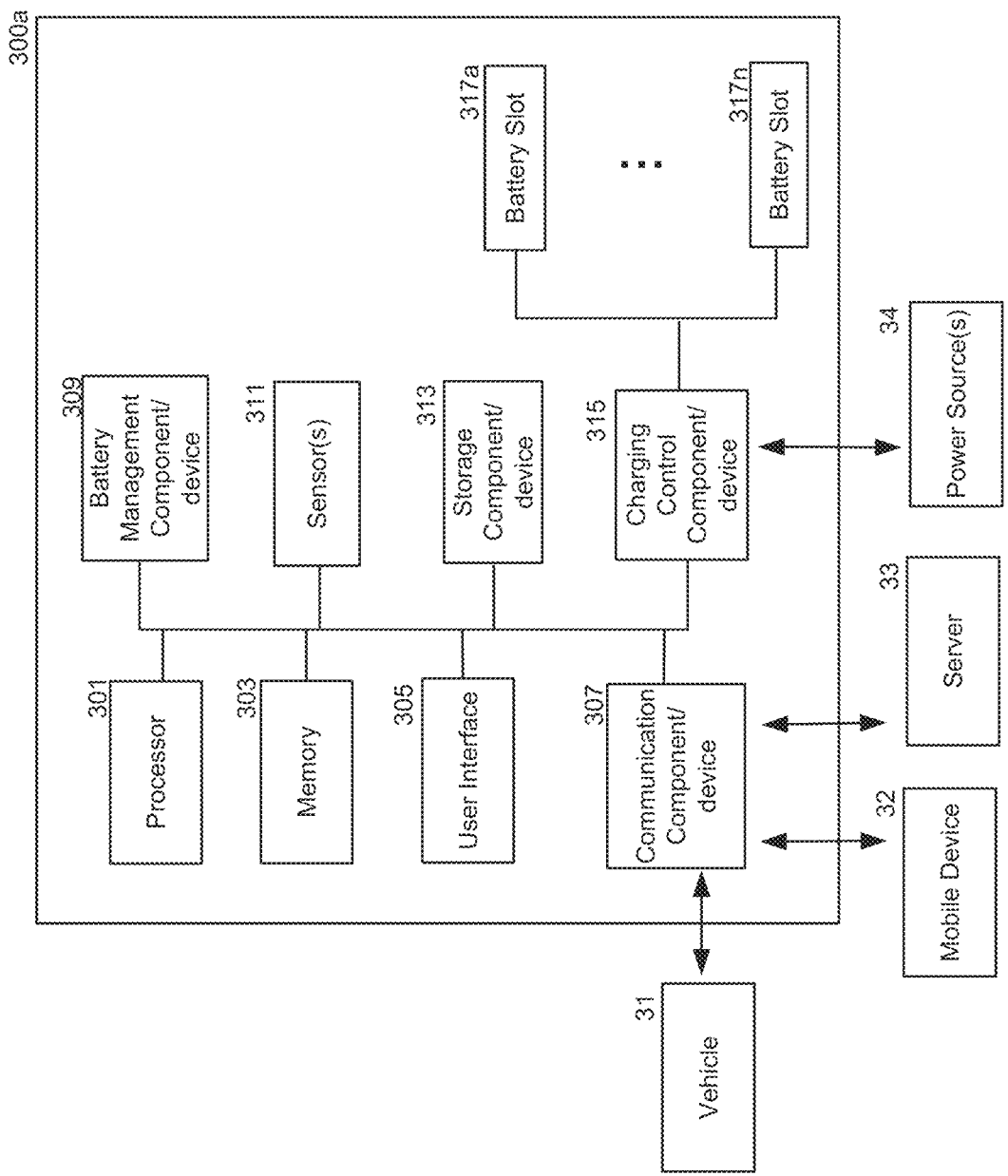
FIGS. 3A and 3B are schematic diagrams illustrating station systems in accordance with embodiments of the disclosed technology.

FIG. 3A is a schematic diagram illustrating a station system 300a in accordance with embodiments of the disclosed technology. As shown, the station system 300a includes a processor 301, a memory 303, a user interface 305, a communication component 307, a battery management component (or battery management system, BMS) 309, one or more sensors 311, a storage component 313, and a charging component 315 coupled to multiple battery slots 317a-n. The processor 301 is configured to interact with the memory 303 and other components (e.g., components 305-317) in the station system 300a. The memory 303 is coupled to the processor 301 and is configured to store instructions for controlling other components or other information in the station system 300a.

The user interface 305 is configured to interact with a user (e.g., receiving a user input and presenting information to the user). In some embodiments, the user interface 305 can be implemented as a touchscreen display. In other embodiments, the user interface 305 can include other suitable user interface devices. The storage component 313 is configured to store, temporarily or permanently, information, data, files, or signals associated with the station system 300a (e.g., information measured by the sensors 311, information collected from the batteries in the battery slots 317a-n, reference information, charging instructions, user information, etc.).

The communication component 307 is configured to communicate with other systems, such as a vehicle 31 (e.g., an electric vehicle that uses the exchangeable battery 201 as its power source), a mobile device 32 (e.g., user's smartphone that has an app configured to manage the exchangeable battery 201), a server 33 (e.g., the server 103, 203 or the server system 400 to be discussed below with reference to FIG. 4), other station stations, and/or other devices.

The battery management component 309 is configured to monitor the status of the batteries in the battery slots 317a-n. The battery management component 309 is also configured to identify/designate UPS batteries (and also UPS candidate batteries, in some embodiments). When power supplied by one or more power sources 34 is interrupted, these UPS batteries can then be used as internal power sources to maintain the operation of the station system 300a.

In some embodiments, the battery management component 309 can manage the batteries positioned in the battery slots 317 based on instructions (e.g., designate the battery as a UPS battery) from the server 33 (which can function in the ways similar to the server 103 and the server system 400 to be discussed in detail below with reference to FIG. 4). In some embodiments, the battery management component 309 can periodically communicate with the server 33 to request update instructions.

In some embodiments, the battery management component 309 can analyze information collected from a battery inserted in one of the battery slots 317 and compare the collected information with a reference information (e.g., a set of battery characteristics associated with multiple batteries). The battery management component 309 can accordingly generate a customized battery charging plan for the inserted battery based on the comparison. In some embodiments, the customized battery charging plan can be determined by the server 33.

The charging component 315 is configured to control a charging process for each of the batteries positioned in the battery slots 317a-n. The battery slots 317a-n are configured to accommodate and charge the batteries positioned and/or locked therein. The charging component 315 receives power from the power sources 34 and then uses the power to charge the batteries positioned in the battery slots 317a-n, based on predetermined customized charging plans, either received from the server 33 or generated by the battery management component 309. When the power from the power source 34 is interrupted, the charging component 315 can draw power from one or more previously designated UPS batteries to charge a battery or to maintain system operations. In some embodiments, the charging component 31 can include one or more converters (AC/DC converter, DC/DC converter, etc.), a bus, a mainboard, or other suitable devices (see e.g., FIG. 3B).

In some embodiments, a customized charging plan (e.g., including designating and utilizing UPS batteries) of the station system 300a can be adjusted based on a battery demand prediction generated by the server 33 (e.g., the battery demand prediction can be generated based on predicted user behavior, station characteristics, events close to a battery exchange station, etc.). For example, the station system 300a can delay implementing a battery charging plan if it determines that there is not sufficient power from the designated UPS batteries.

The sensors 311 are configured to measure information associated with the station system 300a (e.g., working temperature, environmental conditions, power connection, network connection, etc.). The sensors 311 can also be configured to monitor the batteries positioned in the battery slots 317a-n. The measured information can be sent to the battery management component 309 and/or the server 33 for further analysis. In some embodiments, the measured information can be included in the reference information that is used to generate the customized charging plans. For example, the customized charging plans can vary depending on the temperature surrounding the station system 300a or the temperatures at the battery slots 317.

Figure 3B:
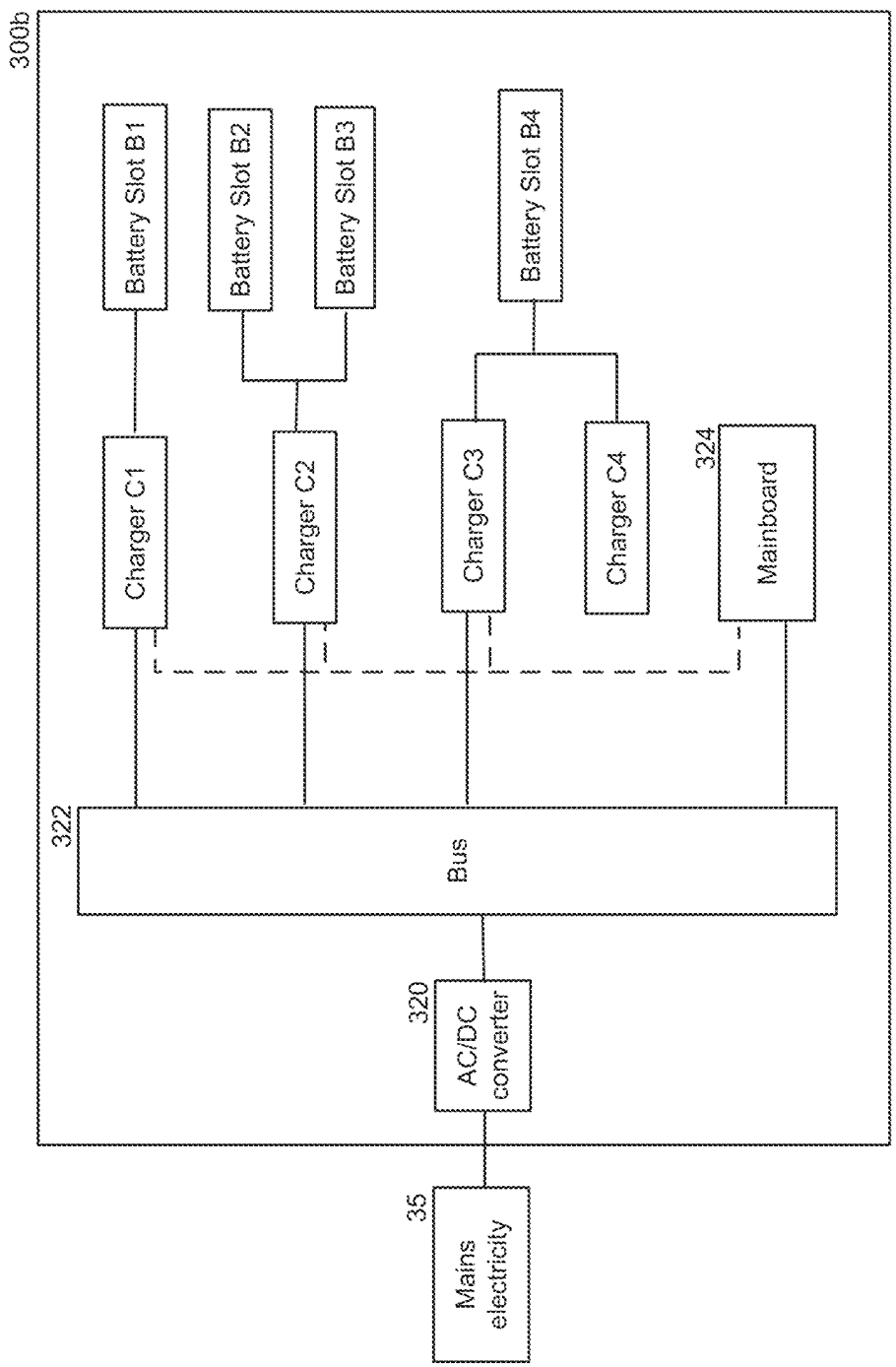

FIG. 3B is a schematic diagram illustrating a station 300b in accordance with embodiments of the disclosed technology. As shown, the station 300b can be electrically coupled to mains electricity 35 (or other suitable power sources, in other embodiments). The station 300b draws power from the mains electricity 35 to maintain its operation, including charging batteries positioned in one or more batteries slots of the station (e.g., four battery slots B1-B4 are shown in FIG. 3B). The station 300b includes an AC/DC converter 320 for converting an alternating current (AC) to a direct current (DC). The AC/DC converter 320 is electrically coupled to a bus 322. As shown, the bus 322 is electrically coupled to a mainboard 324 and one or more chargers of the station 300b (e.g., four chargers C1-C4 are shown in FIG. 3B). As shown, the chargers C1-C4 are further electrically coupled to battery slots B1-B4. In some embodiments, however, the chargers C1-C4 can be electrically coupled to one another without the bus 322. For example, the battery slots B1-B4 can be electrically coupled to the mains electricity 35 via the charger C1-C4 (which are individually and respectively connected to the mainboard 324) without the bus 322. In some embodiments, each of the chargers C1-C4 can individually couple to the mains electricity 35 via an AC/DC converter.

In some embodiments, the mainboard 324 can carry one or more controllers and/or processors configured to control and/or communicate with the individual chargers C1-C4 (the dashed lines shown in FIG. 3B represent signal connections by, e.g., signal lines). For example, the processor on the mainboard 324 can send an instruction to the charger C1 to control a charging process performed thereby. For example, the mainboard 324 can instruct the chargers C1-C4 to charge a battery or stop charging a battery (e.g., by turning on and off a switch corresponding to each of the chargers C1-C4). In some embodiments, when the mains electricity 35 provides power to the station 300b, the switches for the chargers C1-C4 are turned on (which means the chargers C1-C4 can be used to charge batteries). In some embodiments, when the power from the mains electricity 35 is interrupted, some of the switches for the chargers C1-C4 can be turned off. In this configuration, one of the turned-off chargers can be further switched to a discharge mode. The charger in the discharge mode can be used to draw electricity from a coupled battery (i.e., the "discharging" battery) to power another battery or the station 300b. In this embodiment, the discharging battery can act as a UPS battery as discussed herein.

In some embodiments, for example, the processor carried by the mainboard 324 can receive information from the charger C1 (e.g., information stored in a memory attached to a battery positioned in the battery slot B1). In some embodiments, the mainboard 324 can be replaced by or implemented as a computer, an embedded controlling system, or other suitable devices.

In the illustrated embodiment, the charger C1 is electrically coupled to a single battery slot, namely the battery slot B1, the charger C2 is electrically coupled to two battery slots, namely the battery slots B2 and B3, and the chargers C3 and C4 are electrically coupled to a single battery slot, namely the battery slot B4. In other embodiments, however, the station 300b can have different numbers of chargers/battery slots. In some embodiments, the chargers and battery slots can be coupled in different ways (e.g., one charger coupled to four battery slots, etc.).

In the illustrated embodiment, the station 300b receives an alternating current from the mains electricity 35 and then the AC/DC converter 320 convers the alternating current to a direct current. The converted current is sent to the bus 322 and then can be used by the mainboard 324 (or the components/elements carried by the mainboard 324), the chargers C1-C4, and/or other components of the station 300b (e.g., a display).

In some embodiments, the station 300b can further include at least one DC/DC converter configured to convert/regulate/adjust the direct current from the bus 322. In some embodiments, the DC/DC converter can be included in, or integrally formed with, one or more of the chargers C1-C4. In some embodiments, the chargers C1-C4 can be single-directional (e.g., configured to only charge a battery) or bi-directional (e.g., configured to charge and discharge a battery). In such embodiments, the DC/DC converter can be switched so as to switch the corresponding chargers C1-C4 between a charging mode (e.g., the charger is configured to charge a battery coupled thereto) and a discharging mode (e.g., the charger is configured to enable a battery coupled thereto to discharge).

Figure 4:
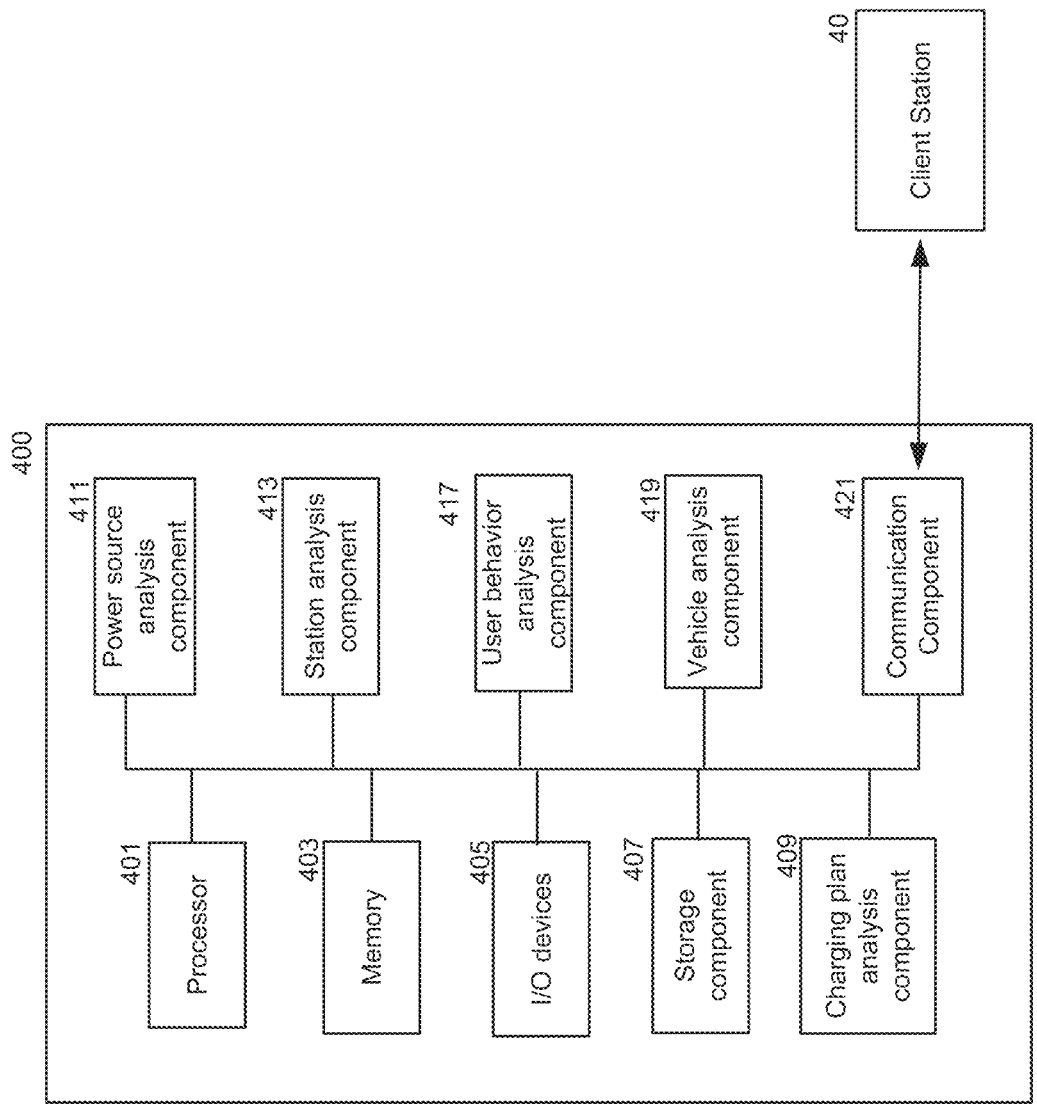
FIG. 4 is a schematic diagram illustrating a server system in accordance with embodiments of the disclosed technology.

FIG. 4 is a schematic diagram illustrating a server system 400 in accordance with embodiments of the disclosed technology. The server system 400 is also configured to collect information associated with multiple batteries that can be deployed or managed by the server system 400. The server system 400 is also configured to analyze the collected information and generate, based on the analysis, a customized battery charging plan (e.g., identifying one or more UPS batteries) for a client station 40 to control a charging process therein. In some embodiments, the client station 40 can be implemented as the battery exchange station 107 or 207 discussed above. In other embodiments, the client station 40 can be implemented as other suitable client devices.

As shown in FIG. 4, the server system 400 includes a processor 401, a memory 403, input/output (I/O) devices 405, a storage component 407, a charging plan analysis component 409, a power source analysis component 411, a station analysis component 413, a user behavior analysis component 417, a vehicle analysis component 419, and a communication component 421. The processor 401 is configured to interact with the memory 403 and other components (e.g., components 405-421) in the server system 400.

The I/O devices 405 are configured to communicate with an operator (e.g., receive an input therefrom and/or present information thereto). In some embodiments, the I/O devices 405 can be one component (e.g., a touch screen display). In some embodiments, the I/O devices 405 can include an input device (e.g., keyboards, pointing devices, card reader, scanner, camera, etc.) and an output device (e.g., a display, network card, speaker, video card, audio card, printer, speakers, or other external device).

The storage component 407 is configured to store, temporarily or permanently, information, data, files, or signals associated with the server system 400 (e.g., collected information, reference information, information to be analyzed, analysis results, etc.). In some embodiments, the storage component 407 can be a hard disk drive, flash memory, or other suitable storage means. The communication component 421 is configured to communicate with other systems (e.g., the client station 40 or other stations) and other devices (e.g., a mobile device carried by a user, a vehicle, etc.).

The charging plan analysis component 409 is configured to collect and store (e.g., in the storage component 407) battery/station information to be analyzed. The collected information can be collected from multiple stations or other sources such as electric vehicles, user mobile devices, etc. After receiving the collected information, the charging plan analysis component 409 can analyze the collected information and then identify one or more UPS batteries for the client station 40.

In some embodiments, the charging plan analysis component 409 can communicate and work together with other components in the system 400 (e.g., components 411-419) to generate a customized battery charging plan for the client station 40. In some embodiments, however, the system 400 can operate without components 411-419.

The power source analysis component 411 is configured to analyze the status (e.g., reliability, stability, continuity, etc.) of one or more power sources that are used to power the client station 40 for charging the batteries therein. For example, the power source analysis component 411 can determine that a power source used to supply power to the client station 40 will be interrupted during 1 a.m. to 3 a.m. on a particular date, and then the power source analysis component 411 can accordingly adjust the charging plan for the client station 40 (e.g., plan to have enough number of UPS batteries during the determined power interruption). In some embodiments, the power source analysis component 411 can also consider the cost for charging in different time periods. For example, the power source analysis component 411 can determine that the charging cost from a power source is reduced during off-peak hours. The power source analysis component 411 can determine whether it is feasible for the client station 40 to charge its batteries during the off-peak hours. If so, the power source analysis component 411 can adjust the charging plan to reduce charging costs.

The station analysis component 413 is configured to categorize the multiple battery stations into various types and identify representative characteristics/patterns for each type, such that the charging plan analysis component 409 can use such information as basis for its analysis. For example, the station analysis component 413 can analyze the collected information and divide the multiple battery stations into various types based on their battery demands. Based on these types, the charging plan analysis component 409 and the station analysis component 413 can quickly determine a suitable battery charging plan, especially in cases where the collected information is insufficient for the charging plan analysis component 409 to perform a normal analysis.

Similar to the station analysis component 413, the user behavior analysis component 417, and the vehicle analysis component 419 are also configured to categorize the user behavior and vehicles powered by the batteries, respectively, into various types and identify representative characteristics/patterns for each type. The user behavior analysis component 417 can categorize the user behavior based on how they exchange and/or use the batteries. For example, a user can be very demanding on battery performance (e.g., a professional racer). As another example, another user may only use battery to power its vehicle for daily errands (e.g., picking up children or grocery shopping). Once a user reserves a battery at the client station 40, the client station 40 then provides information associated with the reservation to the server system 400. The server system 400 can then determine the type/category of the user who made the reservation and accordingly adjust the battery charging plan for the client station 40. In some embodiments, such adjustment can be made by the client station 40.

The vehicle analysis component 419 can categorize the types of vehicles that users are planning to operate. For each type of vehicles, the vehicle analysis component 419 can determine which types of batteries work best for each type of vehicle. For example, the vehicle analysis component 419 can determine that an electric scooter works best with a specific type of battery after a particular charging process. In such embodiments, the vehicle analysis component 419 can work with the charging plan analysis component 409 to adjust the battery demand prediction (and the corresponding charging instructions) if the server system 400 receives related vehicle information. In some embodiments, such information can be found in the user profiles or account information. In other embodiments, such vehicle information can be provided by the client station 40 to the server system 400.

In some embodiments, the server system 400 can generate a customized battery charging plan (e.g., designating one or more UPS batteries) for the client station 40 in a real-time or near real-time manner. In such embodiments, the server system 400 monitors the status of the client station 40. Once there is a change (e.g., a user just removed two fully-charged batteries and left two discharged/depleted ones at the client station 40) or a potential change (e.g., a user makes a reservation to exchange batteries at the client station 40) that may affect the charging process of the client station 40, the server system 400 can perform the analysis mentioned above and generate an updated battery charging plan for the client station 40 to follow. In some embodiments, the change or potential change can be transmitted to the server system 400 from a mobile device (e.g., a user uses an app installed thereon to make a battery reservation), another server (e.g., a web-service server associated with an app used by a user), and/or the client station 40.

Figure 5:
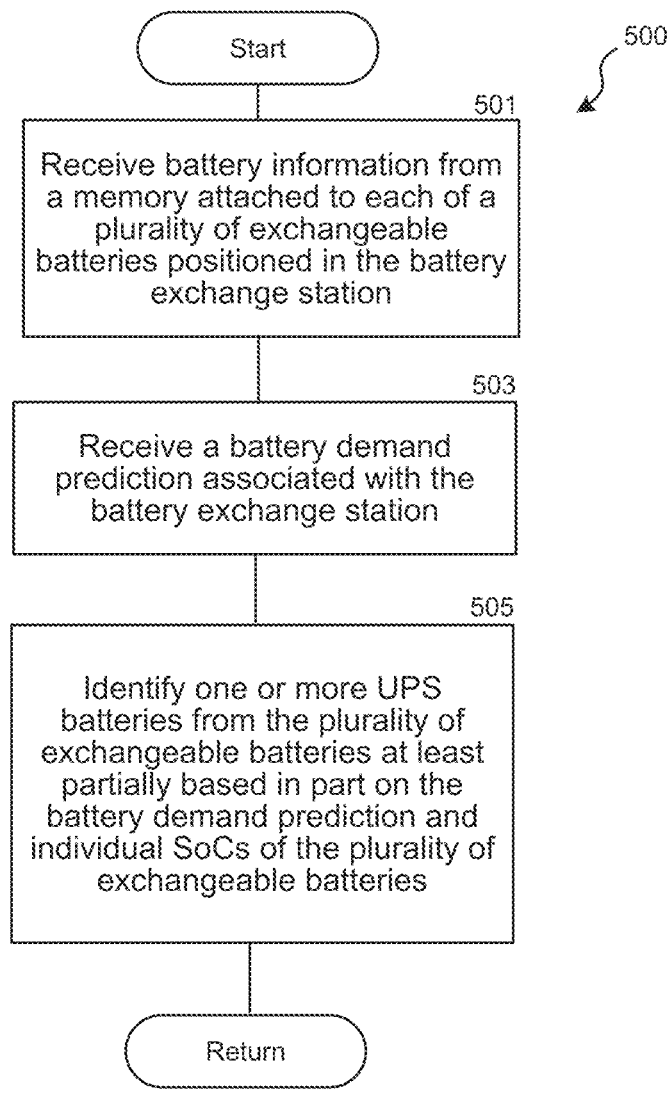
FIGS. 5-8 are flowcharts illustrating methods (e.g., performed by a programed processor) in accordance with embodiments of the disclosed technology.

FIG. 5 illustrates a method 500 for operating a battery exchange station according to a charging plan involving one or more UPS batteries. The method 500 can be implemented in a battery exchange station. The method 500 starts at block 501 by receiving battery information from a memory attached to each of a plurality of exchangeable batteries positioned in the battery exchange station. In some embodiments, receiving the battery information can be performed periodically (e.g., every 1-10 minutes) or in response to an event such as a power interruption, a battery exchange, installation/reboot/maintenance of a battery exchange station, etc. The battery information can include various types of battery characteristics, such as state of charge of a battery, a battery temperature, a battery manufacturer, a manufacturing date/batch, charging/discharging cycles, a temperature profile when the battery discharged or was charged, a battery status (e.g., normal, abnormal, to-be-maintained, to-be-replaced, locked, releasable, dischargeable), a battery life expectancy, etc.

At block 503, the method 500 then receives a battery demand prediction associated with the battery exchange station. In some embodiments, the battery demand prediction can be generated based on empirical or historical data associated with battery demands. In some embodiments, the battery demand prediction can be generated based on a machine learning calculation. In some embodiments, the battery demand prediction can be generated by a server coupled to the battery exchange station. In some embodiments, the battery demand prediction can be generated by the battery exchange station.

At block 505, the method 500 then identifies one or more UPS batteries from the plurality of exchangeable batteries at least partially based in part on the battery demand prediction and individual state of charge of the plurality of exchangeable batteries. For example, in some embodiments, the method 500 can identify the one or more UPS batteries from one or more "locked" batteries (e.g., the batteries that are not to be provided to users for various reasons). In such embodiments, the method 500 will also check whether the battery is "dischargeable." For a battery to be "dischargeable," the battery contains enough electric energy to discharge (e.g., no less than 5-10% SoC). In addition, that battery is currently coupled to a charger that allows bi-directional electric flow. When the battery satisfies the two requirements, it can be qualified as a dischargeable battery. In some embodiments, the method 500 can also designate one or more "UPS candidate batteries" from the remaining dischargeable batteries (to work with the UPS battery to help the station to operate for at least the minimum operation time when its power supply is interrupted). The dischargeable batteries can potentially be designated as UPS batteries and UPS candidate batteries.

How the present method selects UPS batteries can depend on whether there are enough fully-charged batteries in a station. A "fully-charged" battery refers to a battery that has a sufficient SoC (e.g., higher than a threshold SoC). The threshold SoC can vary in different embodiments, for example, ranging from 85% to 99% SoC.

When there are enough fully-charged batteries to be provided to a user, the method 500 can identify a battery that has a high SoC as a UPS battery. The rationale includes that, as long as a battery is fully-charged, the system may want that battery to be picked up by a user as soon as possible, because maintaining a fully-charge battery in the station also consumes power (and thus expenses). For example, assume that the threshold SoC for fully-charged batteries is set at 90% SoC and the station has six batteries with 97%, 93%, 80%, 75%, 65%, and 40% SoC, respectively. In such embodiments, the battery with 97% SoC can be selected as a UPS battery. In some embodiments, where a user typically exchanges two batteries at one time, the two batteries with the highest SoC (97% and 93%) can be selected as UPS batteries.

When there is not enough "fully-charged batteries" to be provided to a user, the method 500 can identify a battery that has a low SoC as a UPS battery. The rationale includes that the system is designed to have at least one battery (or one set/pair of batteries) ready to be exchanged by a user. For example, assume that the threshold SoC for fully-charged batteries is set as 85% SoC and the station has six batteries with 84%, 82%, 80%, 75%, 65%, and 40% SoC, respectively. In such embodiments, the battery with 40% SoC can be selected as a UPS battery. In some embodiments, where a user typically exchanges two batteries at one time, the two batteries with the lowest SoC (65% and 40%) can be selected as UPS batteries.

In some embodiments, the one or more UPS batteries can also be identified based on various factors such as a battery temperature, battery characteristics (e.g., a manufacturer, a manufacturing date/batch, charging/discharging cycles, a temperature profile when the battery discharged or was charged, a battery life expectancy, etc.), a battery status (e.g., normal, abnormal, to-be-maintained, to-be-replaced, locked, releasable, dischargeable, etc.), a total number of batteries in the battery exchange station.

In some embodiments, the method 500 can periodically verify a validity of the UPS batteries. For example, if a UPS battery is exchanged by a user or its SoC no longer fits the requirement discussed above, then that UPS battery is no longer a valid UPS battery. Then the method 500 will go back to block 505 and select one or more suitable UPS batteries.

In case there is no qualifying UPS batteries available/designated when a power interruption occurs (this can be detected by the station or a server), in some embodiments, the method 500 can then initiate a shutdown process to suspend the service of the battery exchange station. In such embodiments, a user can no longer reserve or exchange batteries at this station. Before the completion of the shutdown process, the station can send a signal to a server, notifying that the station can no longer provide services.

In some embodiments, after the UPS batteries have been identified, the method 500 can further determine an order regarding which non-UPS battery can first receive power from the UPS batteries. The order can vary, for example, depending on a battery demand. For example, when a battery exchange demand is high (i.e., "critical hours"), the charging priorities can be in the following order: (1) non-fully-charged batteries, sorted by SoC in a descending order; (2) UPS candidate batteries, sorted by SoC in a descending order; (3) fully-charged batteries, sorted by SoC in a descending order; and (4) "locked" batteries (e.g., those batteries that cannot be exchanged or taken by a user), sorted by SoC in a descending order. These charging priorities are discussed in detail below. With limited power supply (e.g., the UPS batteries), the station will charge the batteries with higher priorities first and then the batteries with lower priorities (e.g., only if the station has remaining power to do so).

First, the station can charge non-fully-charged batteries (whether a battery is "fully-charged" can vary in different embodiments; the threshold can range, for example, from 85% to 99% battery SoC), sorted by their SoCs in a descending order. For example, station A has a 90% SoC threshold (i.e., batteries with 90% SoC or higher are considered fully-charged) and includes three non-fully-charged batteries, with 80%, 65%, and 40% SoC, respectively. In this embodiment, station A can first charge the 80% SoC battery, then the 65% SoC battery, and lastly the 40% SoC battery.

Second, the station can charge UPS candidate batteries, sorted by their SoCs in a descending order. For example, station A has two UPS candidate batteries, with 75% and 71% SoC, respectively. In this embodiment, station A can first charge the 75% SoC battery and then the 71% SoC battery.

Third, the station can charge fully-charged batteries (e.g., non-necessarily 100% SoC, as described above), sorted by their SoCs in a descending order. For example, station A has a 90% SoC threshold and includes two fully-charged batteries, with 95 and 91% SoC, respectively. In this embodiment, station A can first charge the 95% SoC battery, and then the 91% SoC battery.

Fourth, the station can charge "locked" batteries, sorted by their SoCs in a descending order. In some embodiments, a "locked" battery refers to a battery that cannot be provided to a user for various reasons, such as a battery that cannot be charged or discharged, a battery to be collected for maintenance or replacement, a battery with a high temperature (e.g., over 35-40 degrees Celsius), etc. For example, station A includes two locked batteries, with 35% and 15% SoC, respectively. In this embodiment, station A can first charge the 35% SoC battery, and then the 15% SoC battery. In some embodiments, the station can decide not to charge the locked batteries at all.

When a battery exchange demand is not particularly high (i.e., "non-critical hours"), the charging priorities can be in the following order; (i) fully-charged batteries, sorted by SoC in a descending order; (ii) non-fully-charged batteries, sorted by SoC in a descending order; (3) UPS candidate batteries, sorted by SoC in a descending order; and (4) "locked" batteries, sorted by SoC in a descending order. Differences between the charging priorities of a station during "critical hours" and "non-critical hours" include, for example, during "critical hours," the charging priorities of fully-charged batteries are lower than those of the non-fully-charged batteries and UPS candidate batteries. This is because, for example, during "critical hours," a station may not have time to further charge its fully-charged batteries to their 100% SoCs (as described above, the fully-charged batteries can have only 85-99% SoC). Due to a high battery exchange demand, the station may need to provide the fully-charged batteries "as is" so as to meet the high battery exchange demand.

In some embodiments, based on the foregoing charging priorities, a battery exchange station can charge its batteries based on a set of predetermined, battery-specific charging rules (which can be determined based on a predicted battery demand, for example). For example, during "critical hours," the station can "fast charge" a battery (e.g., by using higher voltages or currents). For example, during "non-critical hours," the station can "slow charge" a battery (e.g., by using lower voltages or currents). In some embodiments, the station can "slow charge" locked batteries.

In some embodiments, the station can charge batteries only to a "top-up" threshold. The "top-up" threshold is a SoC threshold when charging a battery that is not to be provided to a user in a short period of time (e.g., in one hour). For example, the system can have a "top-up" threshold of 60-80% SoC, whereas its fully-charged SoC is 85-99% SoC. Based on empirical data, the system can estimate a charging time necessary for a battery to be charged from its "top-up" threshold to its fully-charged SoC (e.g., from 15 minutes to one hour). In such embodiments, the system can first charge a battery to the "top-up" threshold and then wait. When the system expects that a user is going to pick up a battery in a near future (e.g., 20 minutes to 1.2 hours), the system can then start to charge the battery from its "top-up" threshold to its fully-charged SoC, Without wishing to be bound by theory, maintaining a battery at its "top-up" threshold may generate less heat than maintaining the battery at its fully-charged SoC. It is also believed that less generated heat during a charging process can improve battery life. In addition, once a battery is over-charged (e.g., exceeding its fully-charged SoC), the system may need to let it discharge a bit (e.g., to protect it from over-heating). Maintaining a battery at its "top-up" threshold can also avoid such a discharge. Therefore, it is advantageous to adopt the foregoing "top-up" threshold charging concept when charging a battery.

In some embodiments, the UPS candidate battery can also be selected based on the various factors discussed above for selecting the UPS battery, such as the SoC or the charging priorities mentioned above. As discussed above, the UPS candidate battery can be selected to help the UPS battery provide power to operate the station for the minimum operation time. For example, assume that there are six batteries BB1-BB6 in a station, with 95%, 93%, 85%, 70%, 45%, and 40% SoCs, respectively. In this example, the criterial to select the UPS battery can be (1) not selecting batteries with higher than 90% SoCs, because these batteries are ready to be provided to users; and (2) selecting a battery having the highest SoC among the remaining batteries. In this case, battery BB3 with 85% SoC can be selected as the UPS battery and be locked (e.g., not to be charged; being prepared to discharge). Assuming that the minimum operation time is "one hour" and the minimum power for the station to operate for one hour generally equals to "150%" SoC of a battery (assuming batteries BB1-BB6 are the same type of batteries, which means their fully-charged capacities, i.e., 100% SoC, are the same), then battery BB4 can be selected as the UPS candidate battery. In the foregoing example, the power provided by the UPS battery (85% SoC; from battery BB3) and the power provided by the UPS candidate battery (70% SoC from battery BB4) together can support the station to operate for at least the minimum operation time (namely, the sum of 85% and 70% SoCs is greater than 150% SoC) when there is a power interruption.

In the same example, when the power interruption happens, then battery BB3 can immediately start to provide power to support the station's operation. In some embodiments, the UPS battery BB3 and the UPS candidate battery BB4 are not to be provided to a user. In other embodiments, however, the UPS candidate battery BB4 can be provided to a user if the circumstance warrants. For example, the station can expect that the next hour is not a critical hour and therefore there will only be two expected battery exchanges (e.g., batteries BB1 and BB2 are set to fulfill this demand). In this case, when a user comes to the station, asking for a battery with 70% SoC, the station can still provide battery BB4 to that user, even though doing so can result in an early shutdown of the station (i.e., not be able to make it through the minimum operation time).

Figure 6:
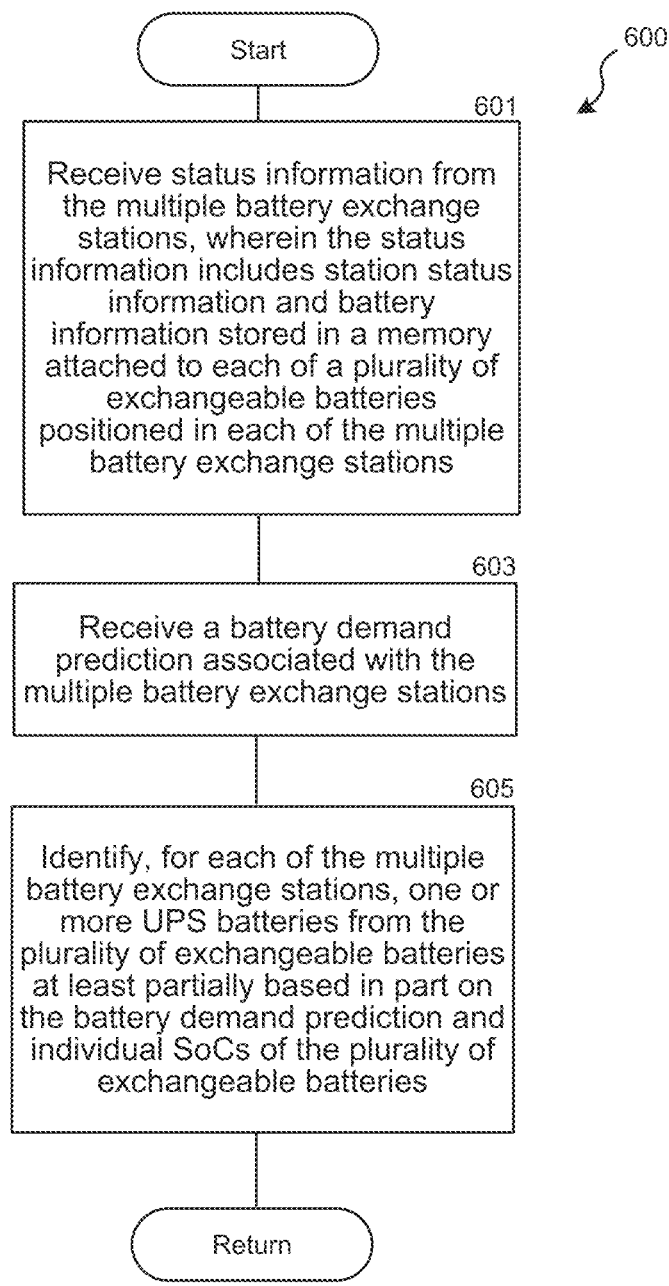

FIG. 6 illustrates a method 600 for operating multiple battery exchange stations involving one or more UPS batteries. The method 600 can be implemented in a server that manages the multiple battery exchange stations. The method 600 starts at block 601 by receiving status information from the multiple battery exchange stations. The status information can include station status information and battery information. In some embodiments, the station status information includes, for example, a total number of batteries in each of the stations, the location of the stations, a current status of power supply (online, offline, normal, abnormal, etc.), whether there is an expected power-interruption and an average recovery time thereof, an expected operational time of the station without an external power supply, an expected battery demand, etc.

In some embodiments, the battery information includes a state of charge (SoC), a battery temperature, battery characteristics (e.g., a manufacturer, a manufacturing date/batch, charging/discharging cycles, a temperature profile when the battery discharged or was charged, a battery life expectancy, etc.), a battery status (e.g., normal, abnormal, to-be-maintained, to-be-replaced, locked, releasable, dischargeable, etc.) and other suitable battery information. The battery information can be stored in a memory attached to each of the exchangeable batteries positioned in the multiple battery exchange stations.

At block 603, the method 600 then receives a battery demand prediction associated with the battery exchange station. In some embodiments, the battery demand prediction can be generated based on empirical or historical data associated with battery demands. In some embodiments, the battery demand prediction can be generated based on a machine learning calculation. In some embodiments, the battery demand prediction can be generated by a server coupled to the battery exchange station. In some embodiments, the battery demand prediction can be generated by the battery exchange station.

At block 605, the method 600 then identifies, for each of the multiple battery exchange stations, one or more UPS batteries (as well as UPS candidate batteries) from the plurality of exchangeable batteries at least partially based in part on the battery demand prediction and individual state of charge of the plurality of exchangeable batteries. In some embodiments, the method 600 can identify the one or more UPS batteries and/or UPS candidate batteries (1) from one or more "locked" batteries (e.g., the batteries that are not to be provided to users for various reasons); (2) due to their high SoCs (e.g., when there are not-enough fully-charged batteries at a station to be provided to a user); and/or (3) due to their low SoCs (e.g., when there are not enough fully-charged batteries at a station to be provided to a user). In some embodiments, the method 600 can also designate priorities to each of the non-UPS batteries. Details are discussed above with reference to embodiments associated with FIG. 5.

Figure 7:
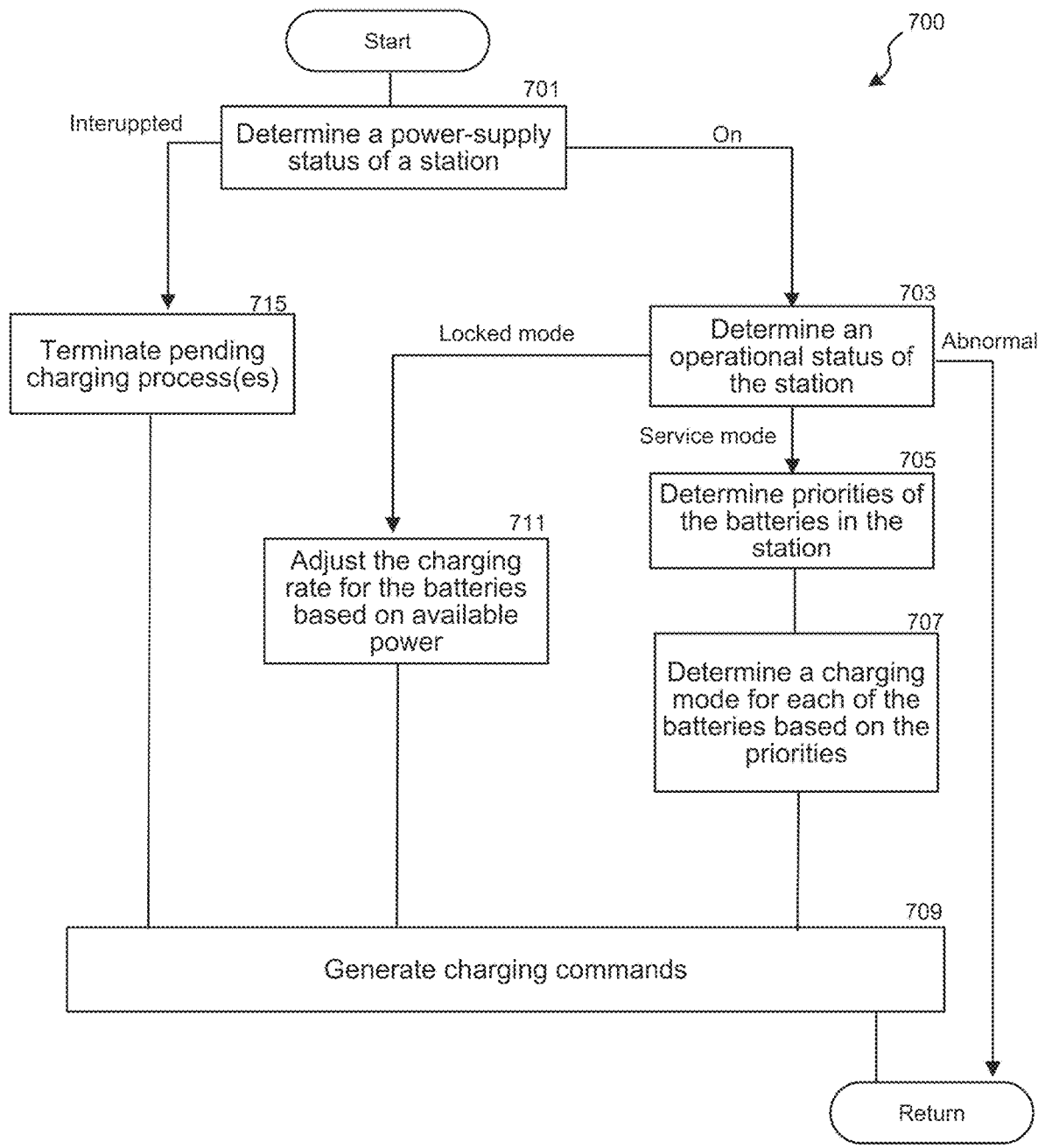

FIG. 7 illustrates a method 700 for operating a battery exchange station involving one or more UPS batteries. The method 700 can be implemented (1) in a server (e.g., the server 103) that manages the multiple battery exchange stations, and/or (2) in a battery exchange station (e.g., the battery exchange stations 107a, 107b, and 207, the station system 300a, the station 300b, etc.). The method 700 starts at block 701 by determining a power-supply status of a station. The power-supply status can be "on" or "interrupted." The "on" status indicates that the station is currently powered by a power source as planned. The "interrupted" status indicates that the power supply to the station is current off or discontinued.

If the power-supply status is "interrupted," the method 700 continues to block 715 to terminate all pending charging process. In other embodiments, the station can still charge some of its batteries by a sacrifice charging process (e.g., using a battery to charge another). The method 700 then moves to block 709 to generate corresponding charging commands (e.g., stop charging). In some embodiments, the charging commands can be generated by the server and then transmitted to the station. In some embodiments, the charging commands can be generated by the station.

If the power-supply status is "on," the method 700 moves to block 703 to determine an operational status of the station. The operational status can include, for example, "service mode," "locked mode" and "abnormal." The "service mode" status indicates that the station is operating properly and can provide battery service to users. The "locked mode" status indicates that the station is currently "locked" by an operator (e.g., due to its limiting charging capacity) for various reasons such as, the ability for the station to charge batteries, a high price of electricity supplied by a power source, etc. In some embodiments, when a station is "locked," the station continues to operate but does not provide battery exchange service to users.

In some embodiments, the "abnormal" status indicates that the station is disconnected or under maintenance. When the operational status is "abnormal," the method 700 then stops, without generating any charging commands for the station. In some embodiments, the method 700 can include sending an alarm or a notice to a system operator to report the "abnormal" status of the station.

When the operational status is "service mode," the method 700 moves to block 705 to determine priorities of the batteries in the station (e.g., the charging priorities discussed above). In some embodiments, the priorities of the batteries can be determined based on SoCs of the batteries. For example, assume that there are six batteries BT1-BT6 having 89%, 75%, 60%, 55%, 50%, and 45% SoC, respectively. Accordingly, battery BT1 can have the highest priority and battery BT6 can have the lowest priority.

Then, based on the priorities, the method 700 can determine a charging mode for each of the batteries, at block 707. In some embodiments, the charging mode can include a fast-charging mode (e.g., using a relatively large current to charge a battery) and a slow-charging mode (e.g., using a relatively small current to charge a battery). In some embodiments, the fast-charging mode can include a step-charging mode (e.g., charging currents vary depending on the SoC of the battery). For example, battery BT2 can be charged in the fast-charging mode so as to make its SoC to reach a threshold (e.g., 90% SoC) as soon as possible. As another example, battery BT1 can be charged in the slow-charging mode because its SoC is very close to the 90% SoC threshold. The method 700 then moves to block 709 to generate corresponding charging commands. Embodiments regarding determining the charging mode are discussed in detail below with reference to FIG. 8.

When the operational status is "locked," the method 700 moves to block 711 to adjust the charging rate for the batteries in the station based on available power. In some embodiments, adjusting the charging rate can include charging the batteries in the slow-charging mode. The method 700 then moves to block 709 to generate corresponding charging commands.

Figure 8:
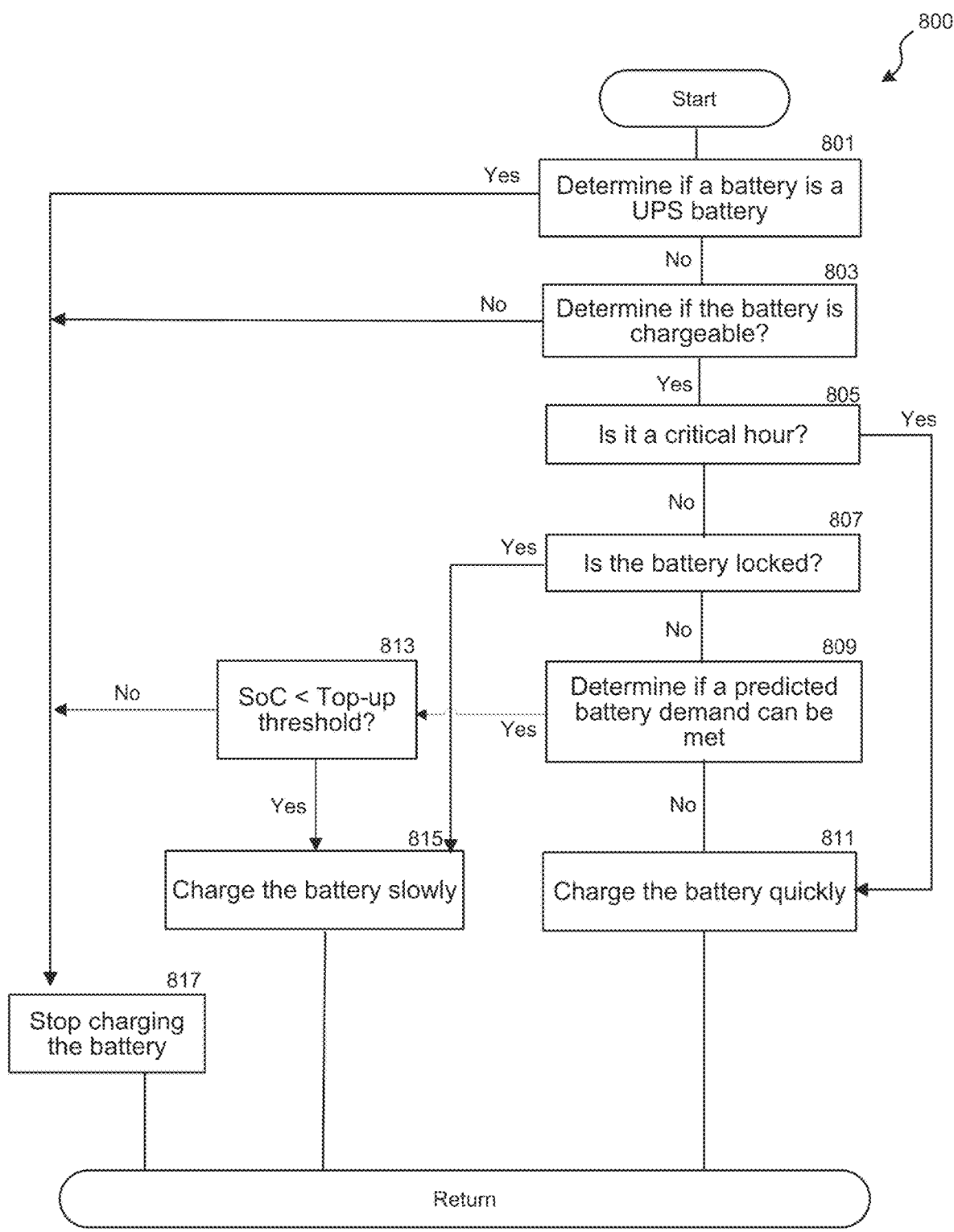

FIG. 8 illustrates a method 800 for determining a charging mode (e.g., fast or slow charging) for a battery. The method 800 can be implemented (1) in a server (e.g., the server 103) that manages the multiple battery exchange stations, and/or (2) in a battery exchange station (e.g., the battery exchange stations 107a, 107b, and 207, the station system 300a, the station 300b, etc.). The method 800 starts at block 801 by determining whether a battery is a UPS battery. As discussed above, there are various factors for this determination, including a state of charge (SoC) of a battery, a battery temperature, battery characteristics, a battery status, a total number of batteries in the battery exchange station, the location of the battery exchange station, a distance between the battery exchange station and a service center, an expected power-interruption recovery time, an expected operational time of the battery exchange station without an external power supply, an expected battery demand, etc. If the battery is a UPS battery, the method 800 moves to block 819 to stop charging that battery. The method 800 then returns.

If the battery is not a UPS battery, the method 800 continues to block 803 by determining whether the battery is chargeable. In some embodiments, a battery is not chargeable when its SoC increase is lower than a threshold after continuously charging it for a period of time. If the battery is not chargeable, the method 800 moves to block 819 to stop charging that battery. The method 800 then returns.

If the battery is chargeable, the method 800 moves to block 805 to further determine whether the expected charging time is a critical hour (e.g., when a battery exchange demand is high, as discussed above). If yes, then the method 800 moves to block 811 to charge the battery quickly (in the fast-charging mode). If not, the method 800 moves to block 807 to further determine if the battery is locked (e.g., not to be provided to a user; to be maintained or replaced, etc.).

If the battery is locked, the method 800 continues to block 815 to charge the battery slowly (e.g., in the slow-charging mode). If the battery is not locked, the method 800 continues to block 809 to further determine if a predicted battery demand can be met based on the current statuses of the batteries in the station. For example, the predicted battery demand can show that there will be two expected battery exchanges in the next hour. Based on the current statuses of the batteries (e.g., their SoCs), the server or the station can determine whether this predicted demand can be met. If not, the method 800 continues to block 811 to charge the battery quickly (in the fast-charging mode). The method 800 then returns.

At block 813, if it is determined that the predicted battery demand can be met, the method 800 then determine whether the SoC of the battery is smaller the top-up threshold (see embodiments above with reference to FIG. 5). If so, then the method 800 continues to block 815 to charge the battery slowly (e.g., in the slow-charging mode). If not (e.g., the battery's SoC is greater than the top-up threshold), the method 800 moves to block 819 to stop charging that battery. The method 800 then returns.

The present technology also includes methods for operating a battery exchange station having a plurality of exchangeable batteries being positioned therein. The method includes (1) selecting one or more UPS batteries from the plurality of exchangeable batteries; and (2) in response to a power interruption of the battery exchange station, instructing the one or more UPS batteries to discharge to sustain an operation of the battery exchange station. In some embodiments, the operation of the battery exchange station includes charging one of more of the plurality of exchangeable batteries that are not selected as the one or more UPS batteries. In some embodiments, the one or more UPS batteries are not to be charged or released.

In some embodiments, the method can further include (1) receiving battery information from memories attached to the plurality of exchangeable batteries positioned in the battery exchange station; and (2) based on the battery information, selecting the one or more UPS batteries.

In some embodiments, the method can further include (1) determining a power consumption for the battery exchange station to operate for a predetermined period of time; and (2) selecting the one or more UPS batteries at least partially based in part on the power consumption. In some embodiments, the predetermined period of time is determined based on a time period for the battery exchange station to perform a shutdown process (e.g., required time for the station to properly shut down). In some embodiments, to provide a "continuous" or "seamless" user experience (e.g., a user will not notice an interruption of service), the battery exchange station can operate as if there is no power interruption. In some embodiments, however, the method can further include visually presenting a warning notice on a display of the battery exchange station. In some embodiments, the warning notice includes an estimate operating time period of the battery exchange station (e.g., "This station will stop providing service in 5 minutes"). In some embodiments, the power consumption can be determined based on other factors such as fulfilling all reserved battery exchange demands.

In some embodiments, the method can further include (1) determining a status of each of the plurality of exchangeable batteries positioned in the battery exchange station; and (2) selecting the one or more UPS batteries at least partially based in part on the statuses of the plurality of exchangeable batteries. In some embodiments, the statuses can be indicative of the SoCs of the plurality of exchangeable batteries. In some embodiments, the statuses can be indicative of whether each of the plurality of exchangeable batteries is located in a two-way charging slot that is capable of charging and discharging one of the plurality of exchangeable batteries. In some embodiments, the statuses can be indicative of whether each of the plurality of exchangeable batteries are dischargeable (e.g., ready to discharge).

In some embodiments, the method can further include (1) receiving a battery demand prediction associated with the battery exchange station; and (2) identifying the one or more UPS batteries at least partially based in part on the battery demand prediction. In some embodiments, the method can further include, in response to a battery exchange at the battery exchange station, updating the one or more UPS batteries. In some embodiments, the method can further include selecting the one or more UPS batteries at least partially based in part on a battery characteristic of each of the plurality of exchangeable batteries.

In some embodiments, the method can further include (1) assigning a priority to each of the plurality of exchangeable batteries, except the one or more UPS batteries; and (2) based on the priority, instructing the one or more UPS batteries to charge at least one of the plurality of exchangeable batteries, except the one or more UPS batteries. In some embodiments, the priority can be determined at least partially based on individual SoCs of the plurality of exchangeable batteries (e.g., similar to the charging priorities discussed above). In some embodiments, the priority can be determined at least partially based on a determination that whether each of the plurality of exchangeable batteries is identified as a UPS battery or a UPS candidate battery. In some embodiments, the priority can be determined at least partially based on a determination that whether each of the plurality of exchangeable batteries is identified as a locked battery.

In some embodiments, the power from the UPS battery is used to support the operations of the station excluding charging other, batteries. However, in some embodiments, the UPS battery (or a locked battery) can be used to charge a battery having a SoC close to a SoC threshold (e.g., 90%) for determining whether a battery is ready to be provided to a user. For example, the UPS battery can be used to charge a battery with 88% SoC such that the battery can soon become ready for exchange once its SoC reaches 90%.

In some embodiments, the method can further include (1) receiving a battery demand prediction associated with the battery exchange station; and (2) identifying the one or more UPS batteries at least partially based in part on the battery demand prediction. In some embodiments, the priority can be determined at least partially based on a determination that whether the battery demand prediction corresponds to a critical hour. In some embodiments, the priority can be determined at least partially based on a determination that whether the individual SoCs of the plurality of exchangeable batteries exceed a top-up SoC threshold. In some embodiments, the method can further include initiating a shutdown process of the battery exchange station when the operation of the battery exchange station is no longer sustained by the one or more UPS batteries.

The present technology also includes methods for operating multiple battery exchange stations. The method includes, inter alia, (1) receiving status information from the multiple battery exchange stations, wherein the status information includes station status information and battery information stored in a memory attached to each of a plurality of exchangeable batteries positioned in each of the multiple battery exchange stations; (2) receiving a battery demand prediction associated with the multiple battery exchange stations; (3) identifying, for each of the multiple battery exchange stations, one or more UPS batteries from the plurality of exchangeable batteries; and (4) in response to a power interruption of one or more of the battery exchange stations, instructing the one or more UPS batteries to discharge to sustain an operation of the one or more battery exchange stations.

Although the present technology has been described with reference to specific exemplary embodiments, it will be recognized that the present technology is not limited to the embodiments described but can be practiced with modifications and alterations within the spirit and scope of the appended claims. Accordingly, the specification and drawings are to be regarded in an illustrative sense rather than a restrictive sense.

The invention claimed is:

1. A method for operating a battery exchange station, a plurality of exchangeable batteries being positioned in the battery exchange station, the method comprising:
   selecting one or more uninterruptible-power-supply (UPS) batteries from the plurality of exchangeable batteries;
   assigning a priority to each of the plurality of exchangeable batteries except the one or more UPS batteries;
   in response to a power interruption of the battery exchange station, instructing the one or more UPS batteries to discharge to sustain an operation of the battery exchange station; and
   receiving a battery demand prediction associated with the battery exchange station; and
   identifying the one or more UPS batteries at least partially based in part on the battery demand prediction,
   wherein the priority is determined at least partially based on a determination that whether the battery demand prediction corresponds to a critical hour.

2. The method of claim 1, wherein selecting the one or more UPS batteries comprises:
   receiving battery information from memories attached to the plurality of exchangeable batteries positioned in the battery exchange station; and
   based on the battery information, selecting the one or more UPS batteries.

3. The method of claim 1, wherein the operation of the battery exchange station includes charging one of more of the plurality of exchangeable batteries that are not selected as the one or more UPS batteries.

4. The method of claim 1, wherein the one or more UPS batteries are not to be charged or released.

5. The method of claim 1, further comprising:
   determining a power consumption for the battery exchange station to operate for a predetermined period of time;
   selecting the one or more UPS batteries at least partially based in part on the power consumption; and
   selecting one or more UPS candidate batteries at least partially based in part on the power consumption.

6. The method of claim 5, wherein the predetermined period of time is determined based on a time period for the battery exchange station to perform a shutdown process.

7. The method of claim 1, wherein selecting the one or more UPS batteries comprises:
   determining a status of each of the plurality of exchangeable batteries positioned in the battery exchange station; and
   selecting the one or more UPS batteries at least partially based in part on the statuses of the plurality of exchangeable batteries.

8. The method of claim 7, wherein the statuses are indicative of state of charges (SoCs) of the plurality of exchangeable batteries.

9. The method of claim 7, wherein the statuses are indicative of whether each of the plurality of exchangeable batteries is located in a two-way charging slot that is capable of charging and discharging one of the plurality of exchangeable batteries, and wherein the statuses are indicative of whether each of the plurality of exchangeable batteries are dischargeable.

10. The method of claim 1, further comprising selecting one or more UPS candidate batteries from the plurality of exchangeable batteries at least partially based in part on a power consumption of the battery exchange station.

11. The method of claim 10, wherein selecting the one or more UPS candidate batteries comprises:
   determining a status of each of the plurality of exchangeable batteries positioned in the battery exchange station; and
   selecting the one or more UPS candidate batteries at least partially based in part on the statuses of the plurality of exchangeable batteries.

12. The method of claim 11, wherein the statuses are indicative of SoCs of the plurality of exchangeable batteries.

13. The method of claim 1, further comprising:
   in response to a battery exchange at the battery exchange station, updating the one or more UPS batteries.

14. The method of claim 1, further comprising:
   selecting the one or more UPS batteries at least partially based in part on a battery characteristic of each of the plurality of exchangeable batteries.

15. The method of claim 1, further comprising:
   based on the priority, instructing the one or more UPS batteries to charge at least one of the plurality of exchangeable batteries, except the one or more UPS batteries.

16. The method of claim 15, wherein the priority is determined at least partially based on individual SoCs of the plurality of exchangeable batteries.

17. The method of claim 15, wherein the priority is determined at least partially based on a determination that whether each of the plurality of exchangeable batteries is identified as a UPS candidate battery.

18. The method of claim 15, wherein the priority is determined at least partially based on a determination that whether each of the plurality of exchangeable batteries is identified as a locked battery.

19. A battery exchange station, comprising:
a processor;
a storage device coupled to the processor and configured to store a battery demand prediction for the battery exchange station; and
a plurality of battery slots coupled to the processor and configured to receive a plurality of exchangeable batteries respectively;
wherein the processor is configured to receive battery information from a memory attached to each of the plurality of exchangeable batteries respectively positioned in the plurality of battery slots;
wherein the processor is configured to receive a battery demand prediction associated with the battery exchange station; wherein the processor is configured to identify one or more uninterruptible-power-supply (UPS) batteries from the plurality of exchangeable batteries based in part on the battery demand prediction;
wherein the processor is configured to assign a priority to each of the plurality of exchangeable batteries except the one or more UPS batteries, and wherein the priority is determined at least partially based on a determination that whether the battery demand prediction corresponds to a critical hour; and
wherein the processor is configured to, in response to a power interruption of the battery exchange station, instruct the one or more UPS batteries to discharge to sustain an operation of the battery exchange station.

* * * * *